United States Patent [19]

Hamuro et al.

[11] Patent Number: 5,174,842
[45] Date of Patent: Dec. 29, 1992

[54] METHOD FOR LAMINATING CERAMIC GREEN SHEETS

[75] Inventors: Mitsuro Hamuro; Kunikazu Nakahara; Hirokazu Higuchi; Kenich Watanabe, all of Kyoto, Japan

[73] Assignee: Murata Manufacturing Co., Ltd., Japan

[21] Appl. No.: 605,995

[22] Filed: Oct. 30, 1990

[30] Foreign Application Priority Data

Oct. 30, 1989 [JP] Japan .................. 1-282189

[51] Int. Cl.⁵ .............................. B32B 31/00
[52] U.S. Cl. ..................... 156/89; 156/265; 156/290
[58] Field of Search ............ 156/89, 290, 256, 264, 156/265; 264/61

[56] References Cited

U.S. PATENT DOCUMENTS 3,235,939 2/1966 Rodriguez et al. ............ 156/89
4,806,188 2/1989 Rellick .................... 156/89

FOREIGN PATENT DOCUMENTS 60-189211 9/1985 Japan .

OTHER PUBLICATIONS

Jap. Pub. No. 02-162710, Patent Abstracts of Japan Sep. 11, 1990.

*Primary Examiner*—Jan H. Silbaugh
*Assistant Examiner*—Christopher A. Fiorilla
*Attorney, Agent, or Firm*—Ostrolenk, Faber, Gerb & Soffen

[57] ABSTRACT

In this method and apparatus, a ceramic green sheet, which may be formed with internal electrodes for forming laminated ceramic capacitors, is first punched out by a punch. After this punching operation, the ceramic green sheet held by the punch is conveyed to a transfer head by the punch and then conveyed to a stacking block by the transfer head. With these steps repeated, a plurality of ceramic green sheets are stacked on the stacking block. Each time a ceramic green sheet is stacked on the stacking block, a hot iron is applied to the uppermost one of the ceramic green sheets so as to pressure-weld it to the underlying ceramic green sheet.

5 Claims, 2 Drawing Sheets

METHOD FOR LAMINATING CERAMIC GREEN SHEETS

BACKGROUND OF THE INVENTION

1. Field of the Invention

This invention relates to a method and apparatus for performing the lamination of ceramic green sheets encountered in the process of production of ceramic electronic components of laminated type.

2. Description of the Background

As a typical example of a conventional ceramic electronic component of laminated type, there is a laminated ceramic capacitor. Generally, laminated ceramic capacitors are produced in the following manner:

(1) Punching out rectangular ceramic green sheets;
(2) Printing internal electrodes on rectangular ceramic green sheets;
(3) Drying printed internal electrodes;
(4) As shown in FIG. 4, alternately laminating ceramic green sheets 2a having internal electrodes 1a and ceramic green sheets 2b having internal electrodes 1b formed in a pattern which differs from that for the internal electrodes 1a;
(5) Rearranging said laminated ceramic green sheets on the basis of their contours;
(6) Putting thus obtained laminate of ceramic green sheets in a die and pressurizing said laminate; and
(7) Cutting the laminate to form chips which are to become individual laminated ceramic capacitors and subjecting said chips to the steps of firing the same and forming outer electrodes thereon so as to provide desired laminated ceramic capacitors However, in the method of producing laminated ceramic capacitors described above, after rectangular ceramic green sheets are punched out in the step (1), the printing of internal electrodes is effected in the step (2). Therefore, if misregistration takes place during the printing of internal electrodes, since lamination is effected on the bases of the contours of the ceramic green sheets in the step (5), there is no opportunity of such misregistration being corrected, so that misregistration is brought into final products. Thus, in laminated ceramic capacitors, there tends to be a scatter in the resulting capacitance.

In the step (5), rearrangement of ceramic green sheets is effected in their laminated state as by applying vibrations thereto to cause their contours to coincide with each other. However, since the mechanical strength of ceramic green sheets is relatively low, the degree of accuracy of lamination cannot be increased. This also forms a cause of the scatter in the capacitance obtained.

After the step (5) has been performed and before the step (6) is performed, misregistration sometimes takes place in the deliberately rearranged ceramic green sheets during the handling of the laminate of ceramic green sheets.

After all, the above-mentioned undesirable phenomenon brings about deviation from the desired position of material films which are to become electrical elements, such as internal electrodes, formed with a predetermined pattern, thereby lowering the quality of the ceramic electronic component of laminated type formed of such laminate.

SUMMARY OF THE INVENTION

Accordingly, an object of the invention is to provide a method and apparatus for laminating ceramic green sheets, capable of preventing deviation from the respective desired positions of material films formed with a predetermined pattern which are to become electrical elements.

In the method of laminating ceramic green sheets according to the invention, to solve the technical problems described above, first, ceramic green sheets formed with material films with a predetermined pattern which are to become electrical elements are prepared. Subsequently, the ceramic green sheet is punched out by a punch. The punched-out ceramic green sheet is conveyed to a transfer bed by the punch. As the ceramic green sheet is held by the transfer bed, it is conveyed to a stacking block, where a plurality of ceramic green sheets are stacked. Then on the stacking block, each time a ceramic green sheet is stacked, a hot iron is applied to the uppermost one of the ceramic green sheets, whereby it is provisionally pressure-welded to the underlying ceramic green sheet.

Further, to solve the technical problems described above, the apparatus for laminating ceramic green sheets according to the invention is characterized by the following arrangement: This laminating apparatus has a punching device comprising a combination of a die and a punch for punching out ceramic green sheets formed with material films with a predetermined pattern which are to become electrical components. In the terminal position for the punching operation by the punch, the transfer head is disposed so that it is positioned in its initial position. The transfer head includes suction holes for sucking a ceramic green sheet by vacuum. Further, the transfer head contains a hot iron. The hot iron is movable between a first position where it is exposed to the surface of the transfer head which holds the ceramic green sheet and a second position where it is not so exposed. At the above-mentioned terminal position for transfer head operation, a stacking block is disposed. The stacking block is used to stack ceramic green sheets thereon.

According to this invention, before the ceramic green sheet is punched out by a punch, it is formed with material films with a predetermined pattern which are to become electrical components. Therefore, the ceramic green sheet is punched out as it is registered with the pattern of the material films. The ceramic green sheet punched out by the punch is conveyed, as it is, to the transfer bed by the punch. Then, the ceramic green sheet held by the transfer head is conveyed onto the stacking block, where it is then stacked. A hot iron is then applied to the ceramic green sheet stacked on the stacking block, whereby the stacked ceramic green sheets are provisionally pressure-welded to each other.

In the apparatus for laminating ceramic green sheets according to the invention, since the hot iron is contained in the transfer head, as soon as a ceramic green sheet is stacked on the stacking block by the transfer head, the hot iron acts to effect pressure-welding between said ceramic green sheet and the underlying one.

Thus, according to the invention, after material films which are to become electrical components have been formed, since the punching-out of ceramic green sheet is effected, even if misregistration is produced during formation of material films, this can be corrected in the punching step.

Further, a ceramic green sheet is punched out by a punch, is, as it is, conveyed to the transfer head by said punch, and is stacked on the stacking block by said transfer head, the causes of misregistration of stacked ceramic green sheets are reduced. Therefore, registration during the stacking of ceramic green sheets can be properly effected.

Further, since the ceramic green sheet is provisionally pressure-welded by the hot iron after stacking, there will be no misregistration of ceramic green sheets taking place in the subsequent steps.

For these reasons, misregistration hardly takes place in the material films formed with a predetermined pattern which are to become electrical elements, and hence the yield of non-defective articles is increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the invention will now be described in connection with production of a laminated ceramic capacitor.

Figure 1:
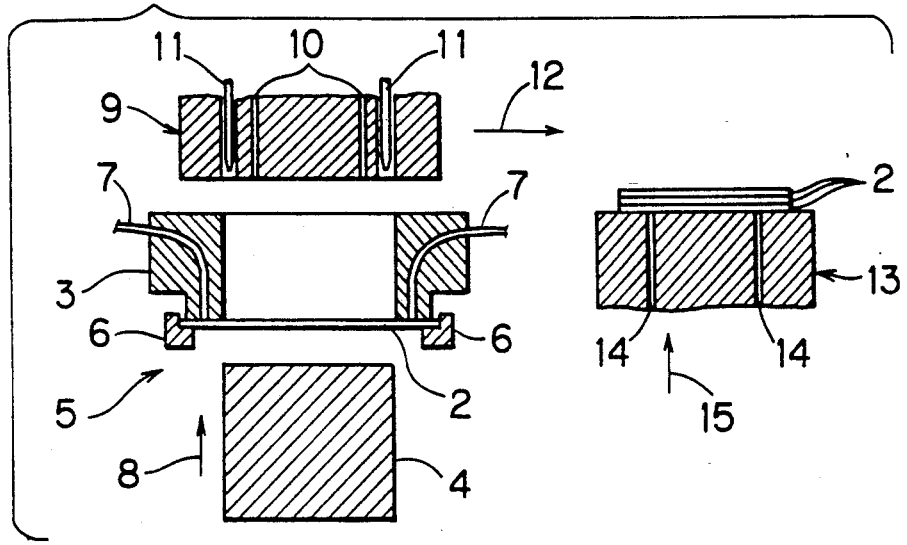
FIG. 1 is a diagrammatic sectional view showing an apparatus for laminating ceramic green sheets according to an embodiment of the invention.

FIG. 1 is a diagrammatic sectional view showing an apparatus for laminating ceramic green sheets according to an embodiment of the invention.

The laminating apparatus includes a punching device 5 comprising a combination of a die 3 and a punch 4 for punching out ceramic green sheets 2. The ceramic green sheet 2 is fed to a position below the die 3 by a feed support 6 while it is held at its opposite sides.

Figure 4:
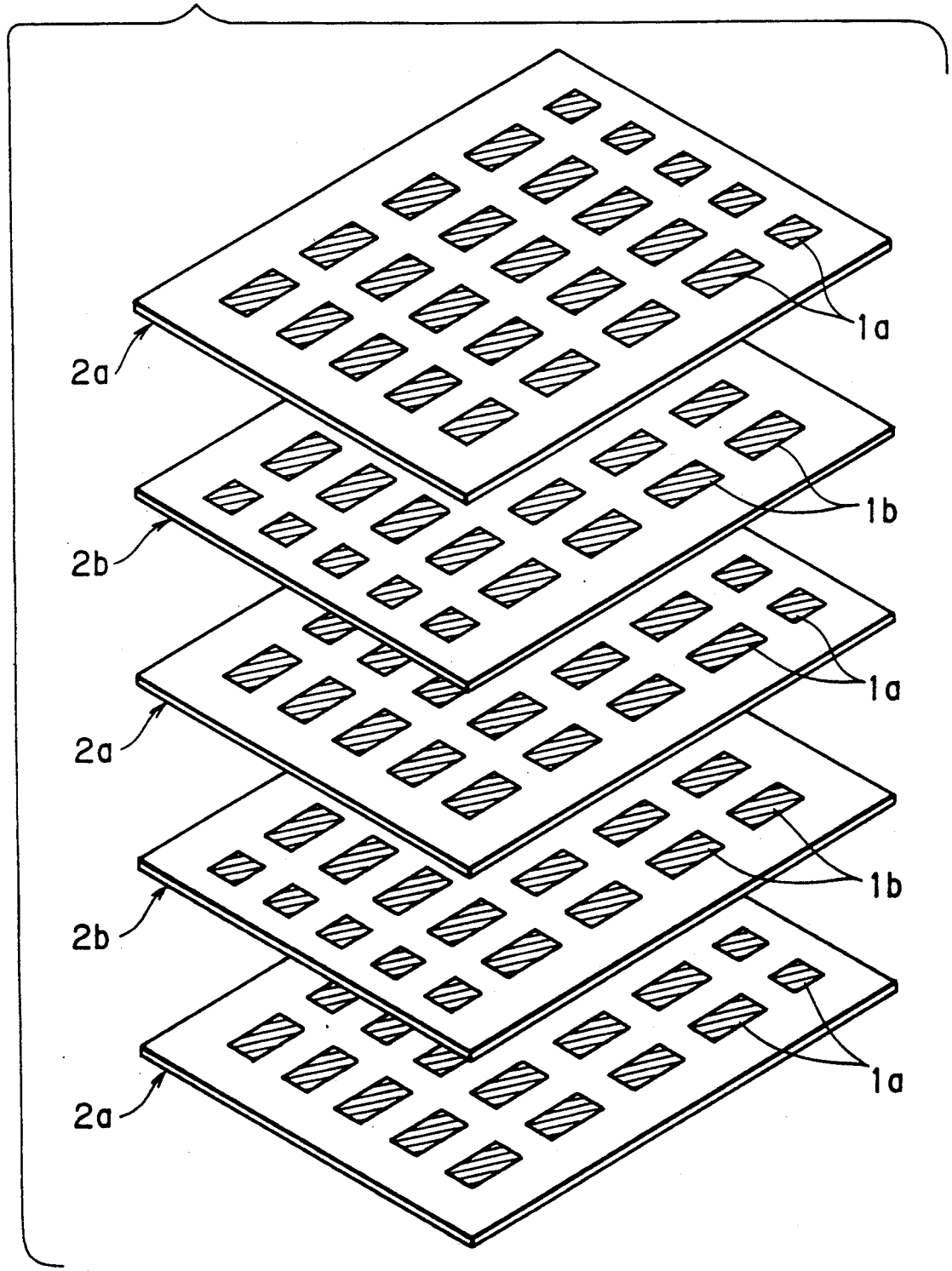
FIG. 4 is an exploded perspective view for explaining the prior art, illustrating ceramic green sheets 2a and 2b respectively formed with internal electrodes 1a and 1b and stacked.

Though not shown, the ceramic green sheet 2 has already been formed with material films, as by printing, with a predetermined pattern for forming predetermined types of electrical components, such as internal electrodes 1a and 1b shown in FIG. 4. Therefore, when the ceramic green sheet 2 is punched out by the punching device 5, a rectangular ceramic green sheet 2a or 2b shown in FIG. 4 is obtained.

The die 3 has position recognizing optical fibers 7 incorporated therein. A positioning mark (not shown) printed in advance on the ceramic green sheet is recognized by an optical recognizing device (not shown) such as a CCD camera through the optical fibers 7, and on the basis of the recognition information generated by the optical recognizing device, the feed support 6 is moved to correct the position of the ceramic green sheet 2.

When the punch 4 is moved as shown by an arrow 8, it cooperates with the die 3 to punch out the ceramic green sheet 2. The punched-out ceramic green sheet 2, held by the punch 4, is moved through the die 3 and conveyed to the transfer head 9. This state is shown in FIG. 2.

It is arranged that the transfer head 9 is positioned at its initial position when the punching operation by the punch 4 is completed. The transfer head 9 has suction holes 10 for holding the ceramic green sheet 2 by the action of vacuum suction. Therefore, the ceramic green sheet 2 conveyed to the transfer head 9 by the punch 4 as described above is held in position under vacuum suction by the transfer head 9.

The transfer head 9 contains hot irons 11 adapted to be heated by electricity, for example. Each hot iron 11 is moved between a first position where it is exposed to the surface of the transfer head 9 which holds the ceramic green sheet 2, i.e., the lower surface, and a second position where it is not so exposed. In FIGS. 1 and 2, the hot irons 11 are shown in the second position. In FIG. 3 to be later described, the hot irons are exposed. The hot irons 11 are positioned in opposed relation to the end edge portions of the punched-out ceramic green sheet 2.

Figure 2:
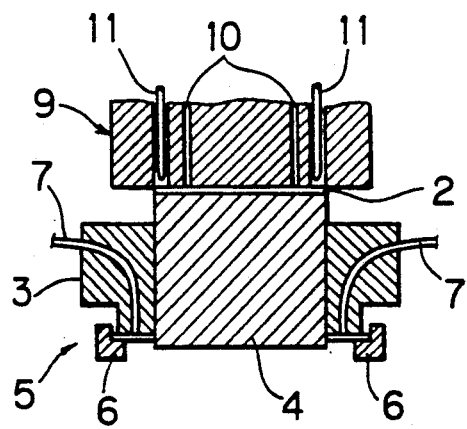
FIG. 2 is a diagrammatic sectional view showing a punching device 5 and a transfer head 9 shown in FIG. 1, illustrating a punched-out ceramic green sheet 2 conveyed to the transfer head 9 after actuation of a punch 4.
Figure 3:
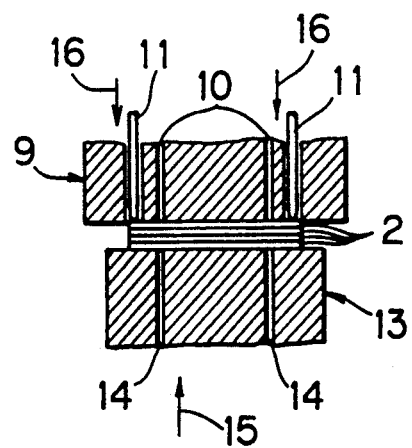
FIG. 3 is a diagrammatic sectional view showing the transfer head and a stacking block 13 shown in FIG. 1, illustrating ceramic green sheets 2 being stacked on the stacking block 13 by the transfer head 9.

As shown in FIG. 2, after the ceramic green sheet 2 has been held by suction by the transfer head 9, the punch 4 is lowered. Subsequently, the transfer head 9, as shown by an arrow 12 in FIG. 1, is transversely moved. A stacking block 13 is disposed at the terminal position for such transverse movement of the transfer head 9. The stacking block 13 is used for stacking thereon ceramic green sheets 2 conveyed thereto by the transfer head 9. The stacking block 13 is preferably provided with suction holes 14 for holding by vacuum suction the lowermost ceramic green sheet 2.

When the transfer head 9 is moved in the direction of arrow 12 until it reaches the terminal position for such movement, as described above, the stacking block 13 is moved upward, as shown by an arrow 15 in FIG. 3. Thereby, as shown in FIG. 3, the ceramic green sheet 2 conveyed by the transfer head 9 is stacked on the stacking block 13. Upon completion of said stacking operation, the hot irons 11 contained in the transfer head 9 are lowered, as shown by arrows 16, to provisionally pressure-weld the end portions of the uppermost ceramic green sheet 2 against the underlying ceramic green sheet 2.

Upon completion of said provisional pressure-welding, air is blown out of the suction holes 10 in the transfer head 9, while the stacking block 13 is lowered. Thus, one complete process of punching, transferring, stacking, and provisionally pressure-welding one ceramic green sheet has been completed.

Thereafter, the same process is repeated a desired number of times, whereby a laminate for a laminated ceramic capacitor is obtained. This laminate is further pressed in a die and completely pressure-welded, whereupon it is suitably cut, fired and formed with external electrodes; thus, desired ceramic capacitors are obtained.

This invention is applicable not only to the production of laminates of ceramic green sheets for a laminated ceramic capacitor described above but to the production of laminates for such electronic components of laminated type as multi-layer circuit boards, LC filters, L chips and C networks of laminated type.

Therefore, what is formed in ceramic green sheets with a predetermined pattern is not limited to internal electrodes; in terms of form, it may be linear, electrically conductive passages, and in terms of material, it may be resistive material or anything that forms material films which are to become electrical elements required for electronic components of laminated type.

Although an embodiment of the present invention has been described and illustrated in detail, it is clearly understood that the same is by way of illustration and example only and is not to be taken by way of limitation, the scope of the present invention being limited only by the terms of the appended claims.

What is claimed is:

1. A method of forming a stack of ceramic green sheets prior to a step of completely pressure-welding said stack, said stack-forming method comprising the steps of:
    (a) preparing a ceramic green sheet;
    (b) punching said ceramic green sheet;
    (c) transferring said ceramic green sheet to a stacking block; and
    (d) applying heat to said ceramic green sheet after it is placed on said stacking block;
    wherein steps (a)-(d) are repeated so as to stack a plurality of said ceramic green sheets on said stacking block, one on top of another; and
    in step (d), localized heat is applied to each one of said ceramic green sheets as it is stacked on said stacking block, so as to provisionally adhere it locally, at the location where said heat is applied, to the underlying ceramic green sheet.

2. A method of forming a stack of ceramic green sheets, to be formed into a predetermined electrical element by subsequent steps including a step of completely pressure-welding said stack, said stack-forming method comprising the steps of:
    preparing a ceramic green sheet having a material film formed thereon in a predetermined pattern which is adapted to form said predetermined electrical element;
    punching out a portion of said ceramic green sheet by a punch;
    conveying said punched-out ceramic green sheet to a transfer head by said punch;
    conveying said ceramic green sheet by said transfer head to a stacking block while holding it, and stacking a plurality of said ceramic green sheets on said stacking block; and
    applying a hot iron to apply localized heat to the top surface of the uppermost one of said ceramic green sheets each time said ceramic green sheet is stacked on said stacking block, so as to provisionally pressure-weld it, without completely pressure-welding it, to the underlying ceramic green sheet and thereby reliably retain said ceramic green sheet on said stack.

3. A method as set forth in claim 2, wherein the step of preparing said ceramic green sheet includes the step of correcting the registration between said ceramic green sheet and said punch.

4. A method as set forth in claim 2, wherein in the step of punching out said ceramic green sheet, said punch is moved upward, while in the step of conveying said ceramic green sheet onto the stacking block and stacking it thereon, said transfer head is moved horizontally and then said stacking block is moved upward.

5. A method as set forth in claim 4, wherein in the step of conveying the ceramic green sheet to the stacking clock, said transfer head retains said ceramic green sheet by the action of vacuum suction.

* * * * *